United States Patent [19]

Ahmed

[11] E Re. 29,910

[45] Reissued Feb. 13, 1979

[54] CURRENT MIRROR AMPLIFIER

[75] Inventor: Adel A. A. Ahmed, Clinton Township, County of Hunterdon, N.J.

[73] Assignee: RCA Corporation, New York, N.Y.

[21] Appl. No.: 880,233

[22] Filed: Feb. 22, 1978

Related U.S. Patent Documents

Reissue of:

[64] Patent No.: 3,973,215
Issued: Aug. 3, 1976
Appl. No.: 601,831
Filed: Aug. 4, 1975

[51] Int. Cl.[2] ..... H03F 1/14; H03F 3/04

[52] U.S. Cl. ..... 330/51; 307/297; 323/4; 330/288; 330/291

[58] Field of Search ..... 323/4; 330/51, 288, 330/296, 291; 307/297

[56] References Cited

U.S. PATENT DOCUMENTS

| | | | |
|---|---|---|---|
| 3,588,672 | 6/1971 | Wilson | 323/4 |
| 3,813,595 | 5/1974 | Sheng | 323/4 |
| 3,843,933 | 10/1974 | Ahmed | 330/26 |
| 3,925,918 | 12/1975 | Wittlinger | 323/4 |

*Primary Examiner*—Lawrence J. Dahl
*Attorney, Agent, or Firm*—H. Christoffersen; Allen LeRoy Limberg

[57] ABSTRACT

A current mirror amplifier circuit with an input current path and an output current path is further provided with a sensing means responsive to the cessation of current flow in the output current path such that the cessation of current flow in the output current path causes the current flow in the input current path to be discontinued.

26 Claims, 5 Drawing Figures

CURRENT MIRROR AMPLIFIER

Matter enclosed in heavy brackets [ ] appears in the original patent but forms no part of this reissue specification; matter printed in italics indicates the additions made by reissue.

The present invention relates to current mirror amplifiers and, more particularly, to a new class of such amplifiers which, unlike those of the prior art, accept no input current when their output circuits are broken.

The term "current mirror amplifier" refers to transistor amplifiers having an inverting current-gain substantially independent of the individual common-emitter forward current gain ($h_{fe}$) of their transistors. Conventionally, this is done by relying upon the proportion between the transconductances of first and second integrated-circuit transistors. The first and second transistors are arranged with their emitter electrodes connected to a common terminal of the current mirror amplifier, their collector electrodes respectively connected to the input terminal and the output terminals of the current mirror amplifier, and the base electrodes similarly connected each to the collector electrode of the first transistor. The first transistor is provided with direct-coupled collector-to-base feedback by the connection of its collector and base electrodes, which adjusts its base-emitter potential to condition the first transistor to conduct as its collector current substantially the entire input current of the current mirror amplifier. Because of the similar base-emitter potentials of the first and second transistors, the collector current of the second transistor flowing through the output terminal of the current mirror amplifier is related to the input current in the same ratio as the transconductance of the second transistor is related to that of the first. The relative transconductances of the transistors depend upon the relative areas of their respective base-emitter junctions, supposing them to have similar base-emitter junction profiles.

The shortcoming of such a prior art current mirror amplifier is that when the circuit is broken between its output and common terminal—that is, when its output load is disconnected—its input current demand continues. This is a waste of power, which may be of serious consequence in equipment using battery power or having a large number of devices operated in a stand-by condition.

The present invention is embodied in a current mirror amplifier wherein the collector-to-base feedback connection of the first transistor is completed only if there be a path for output current flow provided to the current mirror amplifier. In the absence of output current flow, the feedback connection is broken so the first transistor does not accept collector current.

Figure 1:
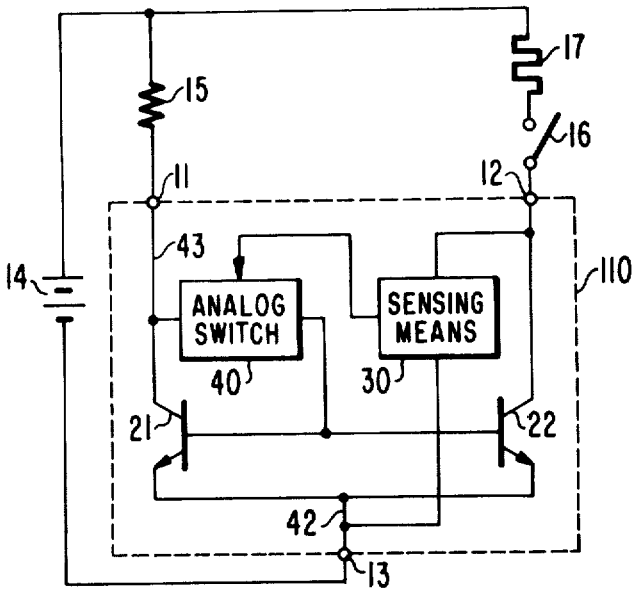
FIG. 1 is a schematic diagram, partially in block form, illustrating a fundamental concept of the present invention.

Referring to FIG. 1, the current mirror amplifier 110 has an input terminal 11, an output terminal 12, and a common terminal 13. Common terminal 13 is connected to the negative terminal of a potential supply 14. Resistor 15 provides a path from the positive terminal of potential supply 14 to the input terminal 11 for input current to amplifier 110. A switch 16, shown in the open position, can be closed to connect a load 17 which has a resistive path therethrough between output terminal 12 of amplifier 110 and the positive terminal of potential supply 14.

Transistors 21 and 22 are the first and second transistors, respectively, of the current mirror amplifier 110. Sensing means 30 responds to switch 16 being closed to conduct current between output terminal 12 and the collector electrode of transistor 22, and to render an analog swith 40 conductive. This sensing may be carried out in either of two ways: (a) the increase in potential between terminals 12 and 13 when switch 16 is closed may be sensed by sensing means 30 or (b) the sensing means 30 may sense the flow of current through a relatively low conductance path, as compared to the collector-emitter path of transistor 22. The conduction of analog switch 40 completes a direct-coupled degenerative collector-to-base feedback connection for transistor 21, permitting transistor 21 to have its base-emitter potential continuously adjusted to condition the transistor to accept essentially the entire input current flow through resistor 15 as its collector current. The base-emitter potential of transistor 21 is applied between the base and emitter electrodes of transistor 22 to adjust its collector current in proportion to that of transistor 21. That is, transistors 21 and 22 cooperate to provide current mirror amplifier action.

When switch 16 is opened, there is no longer a path from the positive terminal of battery 14 via load 17, switch 16 and terminal 12 to the collector electrode of transistor 22 for conducting the collector current of transistor 22. Sensing means 30 responds to this path being discontinued to render analog switch 40 non-conductive. This interrupts the direct-coupled degenerative collector-to-base feedback connection for transistor 21. The base-emitter potentials of transistors 21 and 22 collapse, and both transistors become non-conductive. Not only does current mirror amplifier 110 have no output current flow through the collector-to-emitter path of transistor 22, it has no input current flow through the collector-to-emitter path of transistor 21.

Terminal 11 rises in potential to the potential on the positive terminal of battery 14 when current mirror amplifier action is between transistors 21 and 22. This is advantageous in that, since the poling of potential across the analog switch 40 is always the same, a number of the simpler analog switch configurations are suitable for use in constructing current mirror amplifiers in accordance with the invention. The rise in potential at terminal 11 when current mirror amplifier action as between transistors 21 and 22 is discontinued, also speeds up the reactivation of this action when analog switch 40 is again rendered conductive. No time is required to charge up the stray collector capacitance of transistor 21 to bring it up to operating level, rather the high potential at terminal 11 at this time causes increased drive to be applied to the base electrodes of transistors 21 and 22 to speed up their turn-on. It is, however, possible to replace the analog switch 40 with a direct connection and instead install an analog switch 40 in either connection 42 or 43. Such an analog switch will be called upon to conduct significantly larger currents than analog switch 40, however. Such an analog switch may exhibit a potential drop thereacross which interferes with accurate determination of current mirror amplifier input current by the potential drop across resistor 15, where this method is used to determine input current. An analog switch in connection 42 may raise the minimum potential required between terminals 12 and 13.

The connection of sensing means 30 is shown as being between terminals 12 and 13. If no analog switch is used in connection 42 and transistor 22 is a junction transistor, however, the sensing means 30 may be connected between terminals 12 and 13 via the parallelled base-emitter junctions of transistors 21 and 22, without fear of incurring an undesirable latch-out condition where current mirror amplifier action is not resumed when switch 16 is opened and subsequently closed. When transistor 22 is a junction transistor, the sensing means 30 should be connected in parallel with the collector-base junction of transistor 22 to avoid the undesirable latch-out condition.

While FIG. 1 shows an analog switch 40—i.e., an electrical circuit selectively coupling an electric signal between two points responsive to an electric control signal from a sensing means 30—the interruption of input current flow by means of an electromechanical switch or a switch manually actuated together with switch 16 is also possible within the broader reach of the present invention. Also, switch 16, though shown as a simple S.P.S.T. switch may be part of a more complex manually actuated switch or may be replaced by an electromechanically actuated switch or by an analog switch within the broader reach of the present invention.

Figure 2:
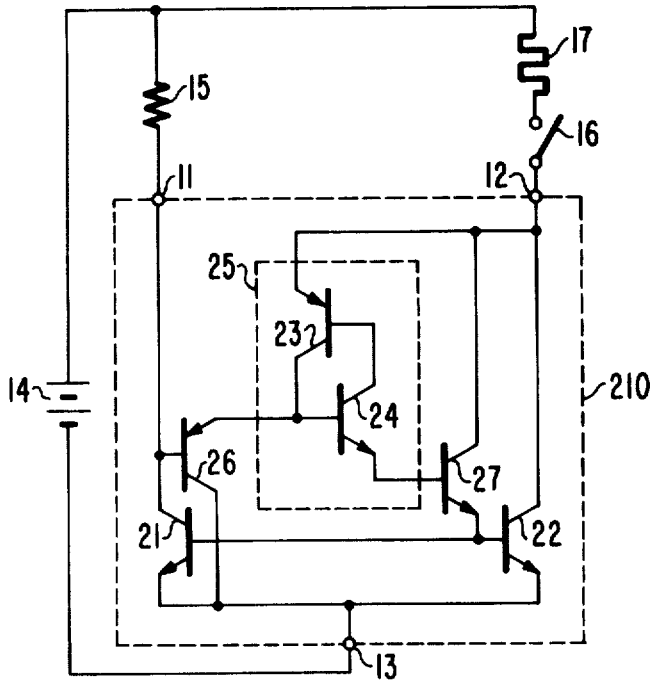
FIGS. 2 and 3 are each a schematic diagram of a current mirror amplifier which embodies the present invention and is constructed entirely of junction transistors.

FIG. 2 shows a current mirror amplifier 210 where the sensing means is connected between terminals 12 and 13 via the paralleled base-emitter junctions of transistors 21 and 22. The sensing means is of the type which offers a relatively low conductance path parallel to that provided by the collector-base junction of transistor 22 and senses the current flow in the relatively low conductance path. This small diverted current is thus made a portion of the base currents required anyway by transistors 21 and 22. Transistors 23 and 24 are complementary-conductivity types connected in a regenerative latch circuit 25.

With switch 16 open, there is no operating current available to cause the regenerative latch circuit 25 to be conductive. The emitter-base junction of transistor 26 is non-conductive for lack of emitter current. There is no means in this condition for forward-biasing the base-emitter junction of transistor 21, so transistor 21 demands no collector current. So, there is no input current drawn through resistor 15, and terminal 11 rises in potential to the potential at the positive terminal of supply 14.

With the closing of switch 16, terminal 12 tends to be raised in potential toward the potential at the positive terminal of supply 14, forward biasing the emitter-base junction of transistor 23. The resultant collector current of transistor 23 is supplied to the base electrode of transistor 24 to cause an amplified collector current response regeneratively applied to the base electrode of transistor 23 to increase its conduction further. Transistor 27 is increasingly pulled into conduction by the increasing emitter current of transistor 24. The increasing emitter current of transistor 27 is apportioned between the base electrodes of transistors 21 and 22 to draw them into increasing conduction.

The increasing collector current of transistor 21 causes an increasing potential drop across resistor 15, decreasing the base potential of transistor 26. At the same time, the increasing current flows in the base-emitter junctions of transistors 21, 22, 27 and 24 is increasing the emitter potential of transistor 26 to a potential offset three times that across a single junction. When the base potential of transistor 26 is only about two junction offset potentials more positive in potential than the negative terminal of supply 14, the base-emitter junction of transistor 26 becomes conductive, diverting the collector current of transistor 23 away from the base electrode of transistor 24 and curbing further growth of the collector currents of transistors 21 and 22.

If switch 16 be re-opened, the lack of emitter current to transistor 23 will cause its conduction be be discontinued and consequently the conduction of the other transistors 26 and 24, 27 and 21 and 22 is discontinued.

Viewing the operation of current mirror amplifier 210 as compared to the general inventive concept, the serial connection of the base-emitter junctions of transistors 26, 24 and 27 provides the analog switch 40. Regenerative latch 25 provides the sensing means 30 sensing the current flow through itself, the base-emitter junction of transistor 27, and the parallelled base-emitter junctions of transistors 21 and 22, which occurs when the switch 16 is closed.

A number of variations of the current mirror amplifier 210 of FIG. 2 occur to the skilled designer, some of which are set forth following. The emitter electrode of transistor 24 may be directly connected to the base electrodes of transistors 21 and 22, dispensing with transistor 27 altogether, which increases the current flow in transistors 23 and 24 somewhat. In high current designs, this will necessitate increasing the size of transistor 23, which is usually constructed with a lateral structure.

Transistor 27, by reducing the current level in the latch circuit 25, reduces the emitter current necessary from transistor 26 to control current growth in amplifier 210; this reduces the base current of transistor 26 and its effect upon the current gain of amplifier 210. Transistor 27 may have its collector electrode connected to the positive terminal of supply 14 to avoid the base currents of transistors 21 and 22 flowing in the output current and affecting the accuracy of the current gain of amplifier 210.

Resistor 15 may be replaced by a constant current source as provided for, by example, from the collector electrode of a PNP transistor biased for providing constant collector current to terminal 11. Emitter degeneration resistors may connect the emitter electrodes of transistors 21 and 22 to common terminal 13. The common-collector amplifier action of transistor 27 in coupling the emitter electrode of transistor 24 to both of the base electrodes of transistors 21 and 22 may be supplanted by the common-collector amplifier action of separate transistors. These separate transistors may, for example, be in Darlington connection with transistors 21 and 22, respectively. A common-collector amplifier may buffer the output terminal 12 from the emitter electrode of transistor 23. A common-base amplifier may connect the collector electrode of transistor 22 to the output terminal 12 to form a cascode to raise the output impedance of amplifier 210; and the base electrode of the transistor in the common-base amplifier may be biased from one of the electrodes of transistor 24, for example.

Figure 3:
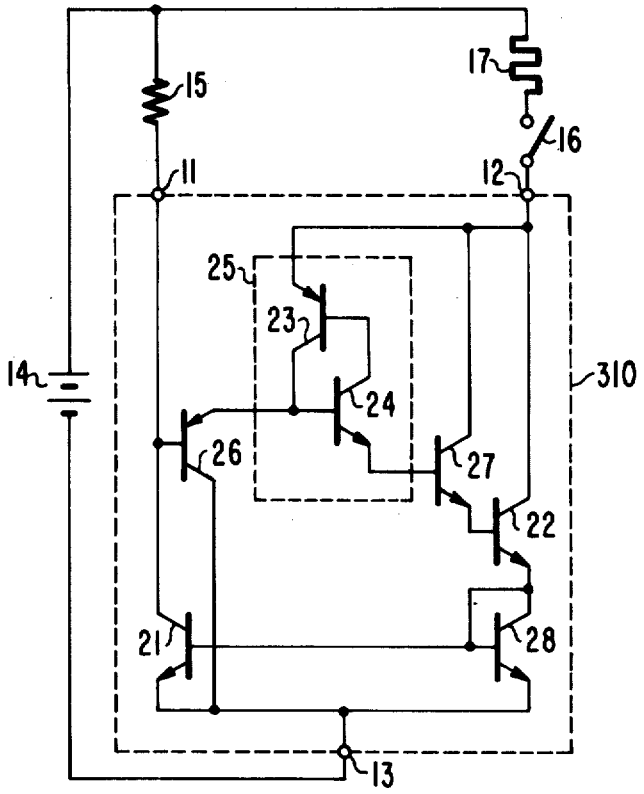
Figure 4:
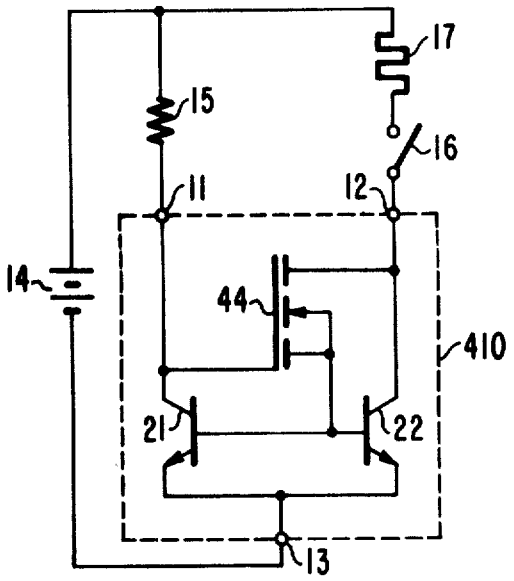
FIGS. 4 and 5 are each a schematic diagram of a current mirror amplifier embodying the present invention and constructed of junction and field-effect transistors.

As shown in FIG. 3, the FIG. 2 configuration can be adapted for use with the commonly used current mirror amplifier 310 wherein the direct-coupled collector-to-base feedback connection of transistor 21 includes the base-emitter junction of transistor 22. In this configuration, the proportionality between the collector currents of transistors 21 and 22 is maintained by means other than the transistors sharing equal base-emitter potentials. Rather, transistors 21 and 28 share equal base-emitter potentials, so their collector currents are accordingly proportioned. The collector current of transistor 28 plus the smaller base currents of transistors 21 and 28 determine the emitter current of transistor 22, and the common-base amplifier action of transistor 22 determines its collector current. The use of the common-collector amplifier, or emitter-follower, action of transistor 22 in the collector-to-base feedback connection of transistor 21 does not affect this connection being completed or discontinued in response to switch 16 being respectively conductive or non-conductive.

Where field-effect transistors as well as junction transistors are available, considerably simpler configurations for implementing current mirror amplifier 110 exist. In FIG. 4, for example, when switch 16 is opened, there is no means to supply current to flow through the drain-to-source path of N-channel field-effect transistor 44 to the base electrodes of transistors 21 and 22, there being no appreciable current flow from the gate electrode of a field-effect transistor to its other electrodes. Without base current supplied to it, transistor 21 is non-conductive. Terminal 11 rises in potential maintaining a gate-to-source potential on transistor 44 to condition it for conduction when switch 16 is again closed. When switch 16 is closed, base current is again supplied to transistors 21 and 22 via the drain-to-source path of transistor 44 and current mirror amplifier action is restored. Transistor 44 provides source-follower action in the restored direct-coupled degenerative collector-to-base feedback connection of transistor 21.

Figure 5:
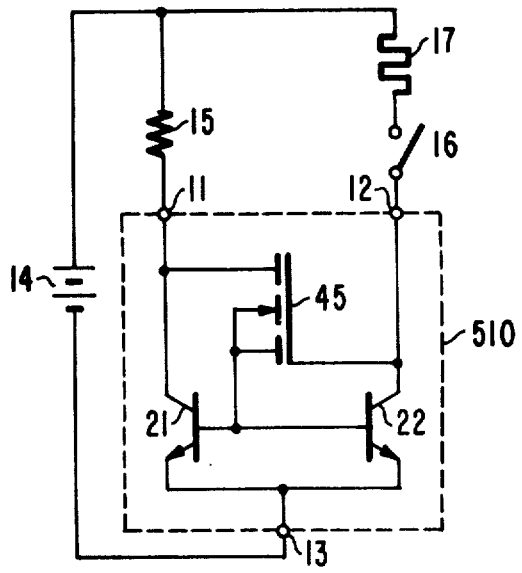

In FIG. 5, as a further example, when switch 16 is opened, potential cannot be sustained between terminals 12 and 13. So, insufficient source-to-gate potential is available to N-channel field-effect transistor 45 to maintain it in conduction. This breaks the direct-coupled degenerative collector-to-base feedback connection of transistor 21 and causes it to cease demanding collector current. Closing of switch 16 provides sufficient gate-to-source potential to transistor 45 to restore it to conduction to operate as a common-gate transistor amplifier in the direct-coupled degenerative collector-to-base feedback connection of transistor 21.

Transistors 21 and 22 in the FIGS. 4 or 5 configuration may be replaced by N-channel field-effect transistors with gate, source and drain connections like the base, emitter and collector connections, respectively, of the transistors 21 and 22. A resistive path may then be provided between the gate-to-gate connection of these field effect transistors and a potential close to or more negative than the potential at common terminal 13 to pull their gate electrodes down when switch 16 is open, so conduction in the transistor replacing transistor 21 will cease.

Each of the configurations described in the foregoing portion of the specification or shown in the Figures, may be constructed using transistors all of the opposite conductivity type to those described or shown.

What is claimed is:

1. In combination:

a current mirror amplifier having an input current path between an input terminal and a common terminal, and an output current path between an output terminal and said common terminal; and means responsive to the cessation of current flow in said output current path for discontinuing the flow of current through said input current path.

2. A combination as set forth in claim 1 wherein said means responsive to the cessation of current flow in said output current path for discontinuing the flow of current through said input path includes means for sensing at least a portion of the potential appearing across said output current path and responding to that portion of the potential falling below a prescribed value to discontinue the flow of current through said input current path.

3. A current mirror amplifier comprising:

input, output and common terminals;

first and second transistors each having a first electrode and each having a principal conduction path between second and third electrodes, the conductivity of which path is controlled by the potential between its first and second electrodes, the first electrodes of said first and said second transistors being connected to each other, the second electrodes of said first and said second transistors being connected to said common terminal, and the third electrodes of said first and said second transistors being connected respectively to said input terminal and to said output terminal;

a degenerative feedback connection between the third and first electrodes of said first transistor; and means responsive to the cessation of current flow through the principal conduction path of said second transistor for discontinuing said degenerative feedback connection.

4. In a current mirror amplifier with a. first and second transistors, each having a first electrode and each having a principal conduction path between second and third electrodes, the conductivity of which path is controlled by the potential between its first and second electrodes, their second electrodes being connected to a common reference potential;

b. a degenerative feedback connection between the third electrode of said first transistor and its first electrode for applying a potential between its second and first electrodes to condition it to conduct input current applied to its principal conduction path;

c. means for applying the same potential to the first electrode of said second transistor as to the first electrode of said first transistor, for implementing an output current flow through the principal conduction path of said second transistor proportionally responsive to any input current flow through the principal conduction path of said first transistor;

d. a load; and e. means for connecting and disconnecting said load to the principal conduction path of said second transistor to receive said output current;

the improvement comprising:

f. an analog switch connected to control the flow of current in the principal conduction path of said first transistor; and g. means responsive to the connection of said load to render said analog switch conductive and responsive to the disconnection of said load to render said analog switch non-conductive.

5. The improvement set forth in claim 4 wherein said analog switch is interposed in said degenerative feedback connection.

6. In a current mirror amplifier with input, output and common terminals, said input and common terminals for receiving an input current;

first and second transistors of a first conductivity type, each having a conduction path;

a direct coupled degenerative feedback connection between the collector and base electrodes of said first transistor, for applying an emitter-to-base potential to said first transistor responsive to said input current;

means for applying an emitter-to-base potential to said second transistor similar to that applied to said first transistor, for causing the respective collector current of said first and said second transistors to be in substantially fixed proportion to each other, the improvement comprising:

means responsive to the absence of output current flow through said output terminal for discontinuing said direct-coupled degenerative feedback connection.

7. The improvement set forth in claim 6 wherein said direct coupled degenerative feedback connection between the collector and base electrodes of said first transistor, said means for applying an emitter-to-base potential to said second transistor similar to that applied to said first transistor, and said means responsive to the absence of output current flow through said output terminal for interrupting said direct-coupled degenerative feedback connection together comprise:

third and fourth transistors of a second conductivity type and a fifth transistor of said first conductivity type, said second conductivity type being complementary to said first conductivity type, each of said third and fourth and fifth transistors having base and emitter and collector electrodes, the emitter electrode of said third transistor being connected to said output terminal, the collector electrodes of said third and said fifth transistors being connected respectively to the base electrode of said fifth transistor and to the base electrode of said third transistor, the emitter electrode of said fifth transistor being connected to the base electrodes of said first and said second transistors, the base electrode of said fourth transistor having the collector electrode of said first transistor having the collector electrode of said first transistor connected thereto, the emitter electrode of said fourth transistor being connected to the base electrode of said fifth transistor, and the collector electrode of said fourth transistor referred to said common terminal.

8. The improvement set forth in claim 6 wherein said direct coupled degenerative feedback connection between the collector and base electrodes of said first transistor, said means for applying an emitter-to-base potential of said second transistor similar to that applied to said first transistor, and said means responsive to the absence of output current flow through said output terminal for interrupting said direct-coupled degenerative feedback connection together comprise:

a third transistor being of the same conductivity type as said first and said second transistors, being a field-effect transistor, having a gate electrode to which the collector of the first transistor is connected, having a source electrode connected to an interconnection between the base electrodes of said first and said second transistors, and having a drain electrode connected to said output terminal.

9. In a current mirror amplifier with input, output and common terminals, first and second transistors having respective emitter electrodes connected to said common terminal, having respective collector electrodes respectively connected to said input terminal and to said output terminal, having respective base electrodes;

a direct coupled degenerative feedback connection between the collector and base electrodes of said first transistor for applying an emitter-to-base potential to said first transistor responsive to said input current;

means for applying an emitter-to-base potential to said second transistor similar to that applied to said first transistor, for causing the respective collector currents of said first and said second transistors to be in substantially fixed proportion to each other, the improvement comprising:

means responsive to the absence of substantial potential appearing between said common and said output terminals for discontinuing said direct-coupled degenerative feedback connection.

10. The improvement set forth in claim 9 wherein said direct-coupled degenerative feedback connection between the collector and base electrodes of said first transistor, said means for applying an emitter-to-base potential to said first transistor similar to that applied to said first transistor, and said means responsive to the absence of substantial potential appearing between said common and said output terminals for interrupting said direct-coupled degenerative feedback connection together comprise:

a third transistor being of the same conductivity type as said first and said second transistors, being a field-effect transistor, having a gate electrode to which said output terminal is connected, having a source electrode connected to an interconnection between the base electrodes of said first and said second transistors, and having a drain electrode to which the collector electrode of said first transistor is connected.

11. A current mirror amplifier comprising:

input, and output and common terminals;

first and second and third transistors of a first conductivity type and a fourth transistor of a second conductivity type complementary to said first conductivity type, each of said transistors having base and emitter and collector electrodes, the emitter electrodes of said first and said second transistors each being connected to said common terminal, the collector electrodes of said first and said second transistors being connected respectively to said input terminal and to said output terminal;

means connecting said third and said fourth transistors in a regenerative latch circuit including the coupling of the collector electrode of each to the base electrode of the other;

means for coupling said output terminal to the emitter electrode of said fourth transistor;

means for coupling the emitter electrode of said third transistor to the base electrodes of said first and said second transistors; and unilaterally conductive means connecting said first transistor collector electrode to said third transistor base electrode and poled for conducting a portion of the collector current of said first transistor.

12. A current mirror amplifier as set forth in claim 11 wherein said unilaterally conductive means comprises the base-emitter junction of a fifth common-collector amplifier transistor of said second conductivity type.

13. A current mirror amplifier as set forth in claim 12 wherein the common-collector amplifier action of at least one further transistor of said first conductivity type provides said means for coupling the emitter electrode of said third transistor to the base electrodes of said first and said second transistor.

14. A current mirror amplifier as set forth in claim 11 wherein the common-collector amplifier action of at least one further transistor of said first conductivity type provides said means for coupling the emitter electrode of said third transistor to the base electrodes of said first and said second transistors.

15. A current mirror amplifier comprising:

input, common and output terminals;

first, second, third, fourth and fifth transistors, each having base and emitter and collector electrodes, said first and second and third and fourth transistors being of a first conductivity type and said fifth transistor being of a second conductivity type complementary to said first conductivity type, the emitter electrodes of said first and said second transistors being connected to said common terminal, the collector electrodes of said first and third transistors being connected respectively to said input terminal and to said output terminal, the collector electrode of said second transistor being connected to the emitter electrode of said third transistor, and the emitter electrode of said third transistor similarly connected to the respective base electrodes of said first and said second transistors;

means connecting said fourth and said fifth transistors in a regenerative latch circuit including the coupling of the collector electrode of each to the base electrode of the other;

means for coupling the output terminal to the emitter electrode of said fifth transistor;

means for coupling the emitter electrode of said fourth transistor to the base electrode of said third transistor; and unilaterally conductive means connecting said first transistor collector electrode to said fourth transistor base electrode and poled for conducting a portion of the collector current of said first transistor.

16. A current mirror amplifier as set forth in claim 15 wherein said unilaterally conductive means comprises the base-emitter junction of a sixth common-collector amplifier transistor of said second conductivity type.

17. A current mirror amplifier as set forth in claim 16 wherein common-collector amplifier action of at least one further transistor of said first conductivity type provides said means for coupling the emitter electrode of said fourth transistor to the base electrode of said third transistor.

18. A current mirror amplifier as set forth in claim 15 wherein common-collector amplifier action of at least one further transistor of said first conductivity type provides said means for coupling the emitter electrode of said fourth transistor to the base electrode of said third transistor.

19. A current mirror amplifier comprising:

input, output and common terminals;

first and second junction transistors having respective collector electrodes respectively connected to said input and said output terminals, having respective emitter electrodes each connected to said common terminal, and having respective base electrodes; and a field-effect transistor having a gate electrode connected to said input terminal and having a source-to-drain path connecting the collector electrode of said second junction transistor to the base electrodes of said first and said second junction transistors.

20. A current mirror amplifier comprising:

input, output and common terminals;

first and second junction transistors having respective collector electrodes respectively connected to said input and said output terminals, having respective emitter electrodes each connected to said common terminal; and having respective base electrodes; and a field-effect transistor having a gate electrode connected to said output terminal and having a source-to-drain path connecting the collector electrode of said first junction transistor to the base electrodes of said first and said second transistors.

*21. A current amplifier comprising:*

*input, output and common terminals;*

*first and second transistors each having a respective first electrode and each having a respective principal conduction path between respective second and third electrodes, the conductivity of which path is controlled by the potential between its first and second electrodes, the second electrodes of said first and said second transistors being connected to said common terminal, and the third electrodes of said first and said second transistors being connected respectively to said input terminal and to said output terminal;*

*means for generating an electric control signal; and*

*analog switch means responsive to said electric control signal for providing a selective connection between said input terminal and a common connection of the first electrodes of said first and second transistors.*

*22. A current amplifier as set forth in claim 21 wherein said analog switch means includes a third transistor of similar conductivity type to said first and second transistors, and fourth and fifth transistors of opposite conductivity type, each of said third, fourth and fifth transistors having a respective first electrode and a respective principal conduction path between respective second and third electrodes, the conductivity of which path is controlled by the potential between its first and second electrodes, the second and third electrodes of said third transistor being respectively connected to said common connection of the first electrodes of said first and second transistors and to the first electrode of said fourth transistor, the second electrode of said fourth transistor having said control signal applied thereto, and the third electrode of said fourth transistor being connected to an interconnection between the first electrode of said third transistor and the second electrode of said fifth transistor, the first electrode of said fifth transistor having said input terminal connected thereto, and the third electrode of said fifth transistor being connected to*

*condition said fifth transistor for operation as an emitter follower whenever said analog switch means provides said selective connection.*

*23. A current amplifier as set forth in claim 21 wherein said analog switch means includes a third transistor being of similar conductivity type to said first and second transistors, having a first electrode and having a principal conduction path between second and third electrodes, the conductivity of which path is controlled by the potential between its first and second electrodes, the first electrode of said third transistor having said input terminal connected thereto, the second electrode of said third transistor being connected to said common connection of the first electrodes of said first and second transistors, and the third electrode of said third transistor having said control signal applied thereto.*

*24. A current amplifier as set forth in claim 21 wherein said analog switch means includes a third transistor which is of enhancement-mode field effect type and of a conductivity type similar to that of said first and second transistors, has a gate electrode to which said input terminal is connected, has a source electrode connected to said common connection of the first electrodes of said first and second transistors, and has a drain electrode to which said control signal is applied.*

*25. A current amplifier as set forth in claim 21 wherein said analog switch means includes a third transistor which is of field effect type, has a drain electrode to which said input terminal is connected, has a source electrode connected to said common connection of the first electrodes of said first and second transistors, and has a gate electrode to which said control signal is applied.*

*26. A current amplifier comprising:*

*input, output, and common terminals;*

*first and second transistors of the same conductivity type, each having a respective first electrode and having a respective principal conduction path between respective second and third electrodes thereof, the conductivity of which path is controlled by the potential between its first and second electrodes, the second electrode of said first transistor being connected to said common terminal, the second electrode of said second transistor being connected to the first electrode of said first transistor, and the third electrodes of said first and second transistors being respectively connected to said input terminal and to said output terminal;*

*resistive means connecting the second electrode of said second transistor to said common terminal;*

*means for generating a control signal; and*

*analog switch means responsive to said electric control signal for providing a selective connection between said input terminal and the first electrode of said second transistor.*

* * * * *